United States Patent
Cerafogli et al.

(10) Patent No.: US 12,362,244 B2
(45) Date of Patent: *Jul. 15, 2025

(54) MEMORY DEVICE INCLUDING CIRCUITRY UNDER BOND PADS

(71) Applicant: Micron Technology, Inc., Boise, ID (US)

(72) Inventors: Chiara Cerafogli, Boise, ID (US); Kenneth William Marr, Boise, ID (US); Brian J. Soderling, Eagle, ID (US); Michael P. Violette, Boise, ID (US); Joshua Daniel Tomayer, Meridian, ID (US); James Eric Davis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 31 days.

This patent is subject to a terminal disclaimer.

(21) Appl. No.: 17/892,749

(22) Filed: Aug. 22, 2022

(65) Prior Publication Data

US 2023/0005799 A1   Jan. 5, 2023

Related U.S. Application Data

(63) Continuation of application No. 16/535,882, filed on Aug. 8, 2019, now Pat. No. 11,424,169.

(51) Int. Cl.
*H10B 41/40* (2023.01)
*G11C 16/04* (2006.01)
(Continued)

(52) U.S. Cl.
CPC .......... *H01L 22/34* (2013.01); *G11C 16/0483* (2013.01); *G11C 16/08* (2013.01);
(Continued)

(58) Field of Classification Search
None
See application file for complete search history.

(56) References Cited

U.S. PATENT DOCUMENTS 9,613,719 B1 *  4/2017  Walker ................. H10B 69/00
11,424,169 B2 *  8/2022  Cerafogli ............. G11C 16/26
(Continued)

FOREIGN PATENT DOCUMENTS

CN  104733463 A  6/2015
CN  106256018 A  12/2016
(Continued)

OTHER PUBLICATIONS

"Chinese Application Serial No. 202010795500.4, Office Action mailed Aug. 16, 2023", w/o English Translation, 9 pgs.
(Continued)

*Primary Examiner* — Xiaoming Liu
(74) *Attorney, Agent, or Firm* — Schwegman Lundberg & Woessner, P.A.

(57) ABSTRACT

Some embodiments include apparatuses and methods of fabricating the apparatuses. One of the apparatuses includes a substrate of a semiconductor die; a memory cell portion located over a first portion of the substrate; a conductive pad portion located over a second portion of the substrate and outside the memory cell portion; and a sensor circuit including a portion located over the second portion of the substrate and under the conductive pad portion. The conductive pad portion includes conductive pads. Each of the conductive pads is part of a respective electrical path coupled to a conductive contact of a base outside the substrate.

20 Claims, 7 Drawing Sheets

(51) Int. Cl.
    *G11C 16/08*     (2006.01)
    *G11C 16/26*     (2006.01)
    *G11C 29/14*     (2006.01)
    *H01L 21/66*     (2006.01)
    *H01L 23/00*     (2006.01)
    *H01L 23/528*     (2006.01)
    *H03K 3/03*     (2006.01)
    *H10B 41/27*     (2023.01)
    *H10B 43/27*     (2023.01)
    *H10B 43/40*     (2023.01)

(52) U.S. Cl.
CPC .............. *G11C 16/26* (2013.01); *G11C 29/14* (2013.01); *H01L 22/20* (2013.01); *H01L 23/528* (2013.01); *H01L 24/05* (2013.01); *H01L 24/48* (2013.01); *H03K 3/0315* (2013.01); *H10B 41/27* (2023.02); *H10B 41/40* (2023.02); *H10B 43/27* (2023.02); *H10B 43/40* (2023.02); *H01L 24/49* (2013.01); *H01L 2224/04042* (2013.01); *H01L 2224/48091* (2013.01); *H01L 2224/48106* (2013.01); *H01L 2224/48227* (2013.01); *H01L 2224/49176* (2013.01)

(56) References Cited

U.S. PATENT DOCUMENTS

| | | | |
|---|---|---|---|
| 2010/0278211 A1* | 11/2010 | Pu | H01L 22/34 374/57 |
| 2010/0320526 A1* | 12/2010 | Kidoh | H10B 43/27 257/E21.409 |
| 2019/0257696 A1* | 8/2019 | Rachala | G01K 15/005 |
| 2020/0203329 A1* | 6/2020 | Kanamori | H01L 24/09 |
| 2021/0043525 A1 | 2/2021 | Cerafogli et al. | |

FOREIGN PATENT DOCUMENTS

| | | |
|---|---|---|
| CN | 107004663 A | 8/2017 |
| CN | 109891586 A | 6/2019 |
| CN | 112436009 A | 3/2021 |

OTHER PUBLICATIONS

"Chinese Application Serial No. 202010795500.4, Response Filed Dec. 29, 2023 to Office Action mailed Aug. 16, 2023", w/ English Claims, 23 pgs.

* cited by examiner

MEMORY DEVICE INCLUDING CIRCUITRY UNDER BOND PADS

PRIORITY APPLICATION

This application is a continuation of U.S. application Ser. No. 16/535,882, filed Aug. 8, 2019, which is incorporated herein by reference in its entirety.

BACKGROUND

Memory devices are widely used in computers and many other electronic items to store information. A memory device often includes a semiconductor die where memory cells and associated circuitry are formed. Many packaging techniques are available to assemble the die in a package. Such a package is also referred to as an integrated circuit (IC) package or IC chip. The package has electrical connections to allow transmission of electrical signals between circuitries on the die and external devices outside the package.

Packaging processes during assembly can induce stress on the die. Such stress can be difficult to detect. Thus, normally only permanent damages (e.g., damaged after the package is assembled) can be observed. Some conventional techniques of detecting die stress due to assembly of the die are often based on a limited number of failing dies. Such conventional techniques also usually lack data that shows the impact of die stress from assembly on circuitries of the die. Moreover, circuitries of the die may suffer from process variations during fabrication of a memory device. Some conventional techniques may use limited data from a small sample of dies to quantify and predict the expected impact of such process variations. These limitations of conventional techniques can reduce yield, introduce marginalities in die functionality, create reliability issues during normal mode of operations of the memory device that includes the die, and/or other drawbacks discussed below.

DETAILED DESCRIPTION

The techniques described herein include providing an active monitor on a die of a memory device for analyzing (e.g., risk assessment) the properties (e.g., electrical and physical properties) of a particular portion of the die. In an example, the active monitor includes a sensor circuit embedded in the die. The sensor circuit can be enabled during different stages (e.g., pre-package and post-package stage) of fabrication of the memory device to provide evaluation information. The evaluation information collected from the sensor circuit can help detection of variations in the process (e.g., CMOS process) of fabricating the memory device. The collected evaluation information can also allow analysis on the impact of stress on the die during packaging assembly (e.g., during pre-package and post-package stage). In an example, ring oscillators are included in the sensor circuit. The sensor circuit can be formed at locations (e.g., under conductive bonding pads) that is often subject to bonding and package stress. The techniques described herein can allow reliable circuitry to be formed in more locations (e.g., under conductive bonding pads) of the die that normally would be wasted. The techniques described herein can also allow detection of stress on the die during assembly, thereby correction can be made to reduce or eliminate the number of dies that have permanent damage. The described techniques can improve yield, maintain the reliability of the circuitry in the memory device, and improve fabrication process. Other improvements and benefits of the described techniques are discussed below with reference to FIG. 1 through FIG. 7.

Figure 1:
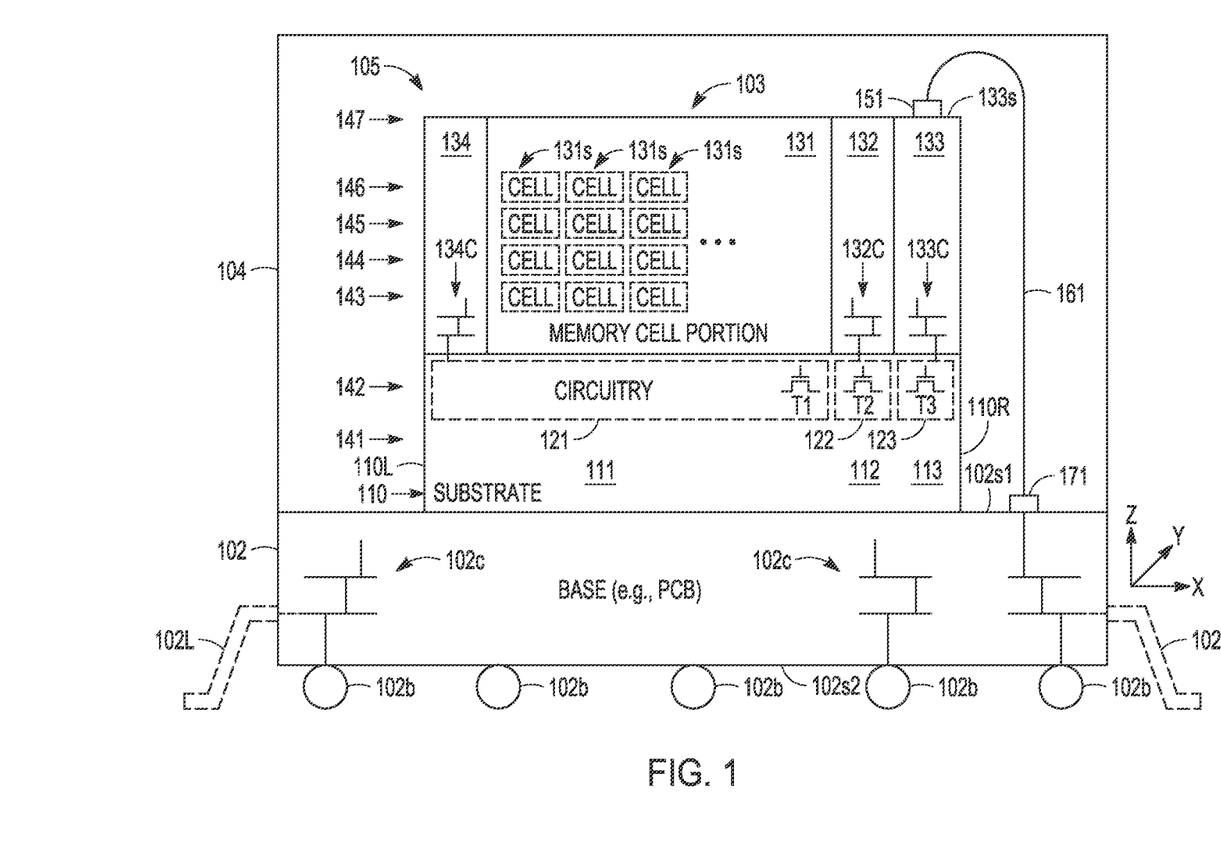
FIG. 1 shows a side view of a package including a base, a die, and an enclosure, according to some embodiments described herein.

FIG. 1 shows an apparatus in the form of a structure of package 101 including a base 102, a die 103, and an enclosure 104, according to some embodiments described herein. Package 101 can be an electronic package (e.g., IC package) that can include a grid array (e.g., ball grid array (BGA) package), a thin small outline package (TSOP), a universal flash storage (UFS) package, or other types electronic packages. The apparatus having package 101 can include or be included (e.g., can be a part of) a system, for example, a system-on-chip (SoC), system on package (SoP), a solid state drive (SSD), a cellphone, a tablet, a computer, an electronic module in an automobile, or other types of electronic systems.

As shown in FIG. 1, package 101 can have components (e.g., circuit elements) located in the X, Y, and Z directions (e.g., dimensions). The X-direction and the Y-direction are perpendicular to each other and perpendicular to the Z-direction. FIG. 1 shows a side view (e.g., cross-sectional view) of package 101 in the X-Z directions. Other views of package 101 are shown in FIG. 2, and FIG. 3.

Figure 2:
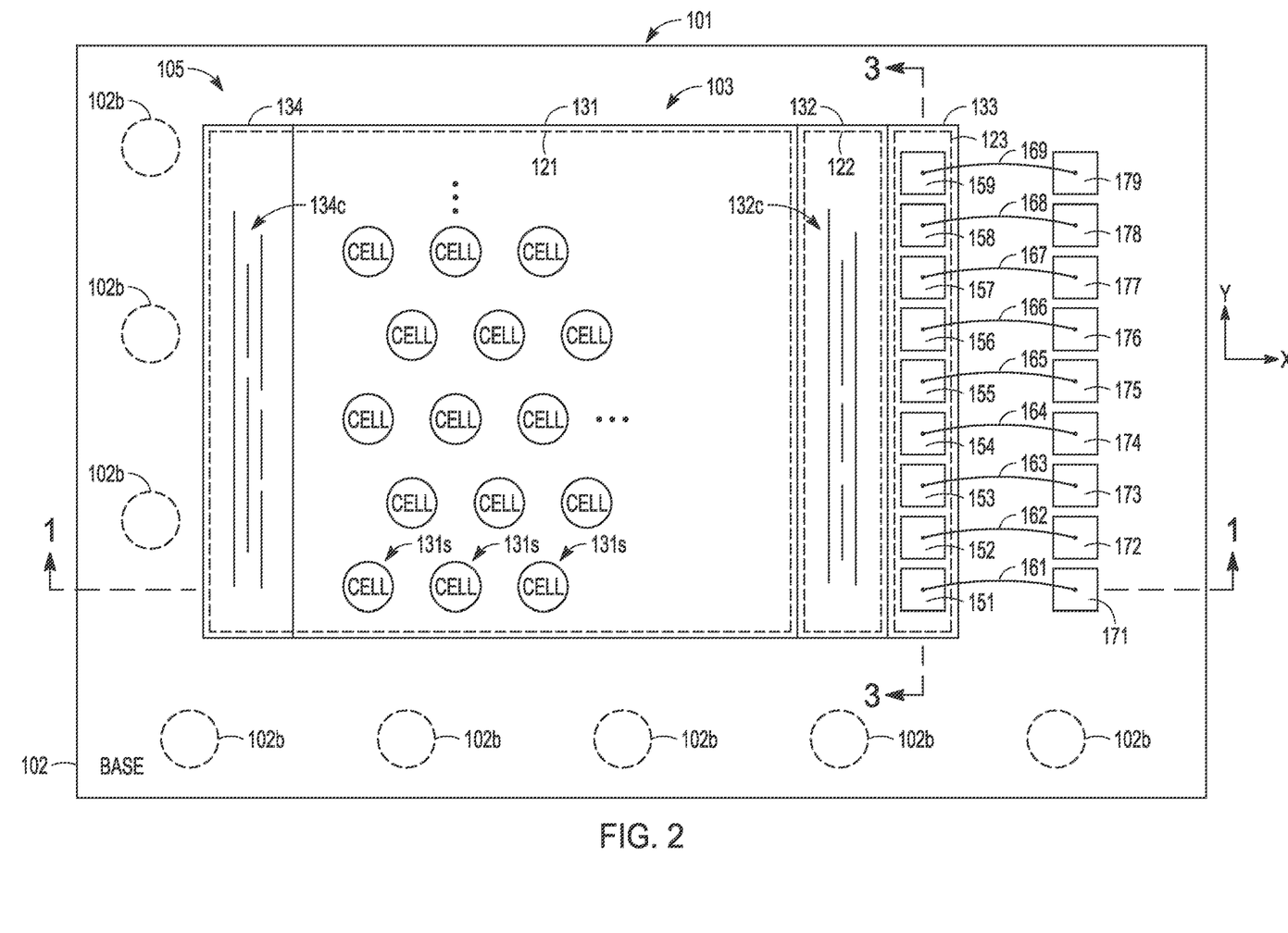
FIG. 2 shows a top view of the package of FIG. 1 including conductive pads of the die, conductive contacts of the base, and wires (e.g., bonding wires) connecting between the conductive pads and the conductive contacts, and outlines (e.g., layout) of circuitries located under respective portions of the die, according to some embodiments described herein.
Figure 3:
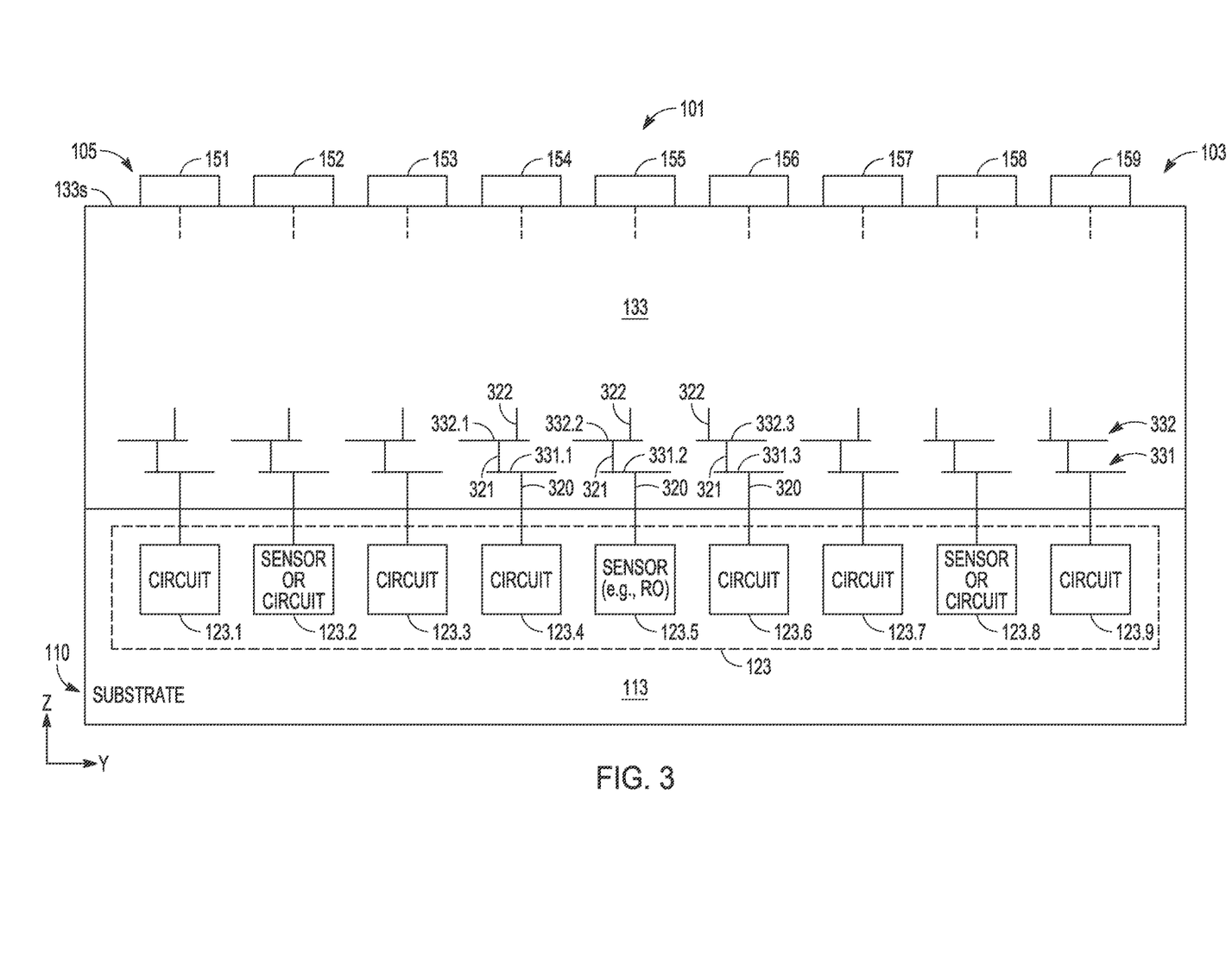
FIG. 3 shows a side view in the Y-Z direction of the package of FIG. 1 including circuits of the circuitry located under a conductive pad portion of the die of the package, according to some embodiments described herein.

FIG. 2 shows a top view (e.g., plan view) of package 101 in the X-Y directions. A portion of package 101 along line 1-1 (e.g., cross-sectional line) can be seen in FIG. 1. FIG. 3 shows a side view (e.g., cross-sectional view) of package 101 can be taken from line 3-3 (e.g., cross-sectional line) in FIG. 2. In the description herein, the dimensions (e.g., physical structures) of the elements shown in the drawings are not scaled. For simplicity, some components of package 101 may be shown in one view (side view) of package 101. However, some of those components may be omitted from another view (e.g., top view) of package 101. The following description refers to FIG. 1 and FIG. 2.

As shown in FIG. 1, package 101 can include a memory device 105 where die 103 can be part of memory device 105. Although memory device 105 is described as being part of package 101, memory device 105 can include the entire package 101.

Memory device 105 can include a non-volatile memory device. For example, memory device 105 can include a flash memory device (e.g., a NAND flash memory device) or another type of non-volatile memory device. Alternatively, memory device 105 can include a volatile memory device. Die 103 of memory device 105 can be called a NAND memory die if memory device 105 is a NAND memory device.

Base 102 (FIG. 1 and FIG. 2) of package 101 (which is also the base of memory device 105) can be configured (e.g., structured) to provide electrical connections between components of package 101 (e.g., circuitries in die 103) and other devices outside package 101 (e.g., devices external to package 101). Base 102 can include a circuit board (e.g., a printed circuit board), a lead frame, a combination of both, or another type base. As shown in FIG. 1 and FIG. 2, base 102 can include conductive contacts 171, 172, 173, 174, 175, 176, 177, 178, and 179 (171 through 179) located on a surface 102s1 of base 102 (e.g., a surface on the top side of base 102). Base 102 can include a lead frame, such that at least one of conductive contacts 171 through 179 can be part of the lead frame. Each of conductive contacts 171 through 179 can include a conductive material (e.g., or materials) that can include a single metal or an alloy. Example materials for conductive contacts 171 through 179 include copper, gold, and other conductive materials. FIG. 1 and FIG. 2 show each of conductive contacts 171 through 179 having a polygon (e.g., square or rectangular) shape as an example. However, each of conductive contacts 171 through 179 can have a different shape.

Base 102 can include conductive connections (electrical connections) 102b that can be located on a surface 102s2 of base 102 (e.g., a surface on the bottom side of base 102). Connections 102b can include solder balls or solder bumps (e.g., if package 101 is a BGA package) or other conductive materials. In an alternative structure of package 101, base 102 can include leads 102L (e.g., if package 101 is a TSOP). Connections 102b (or alternatively leads 102L) can be part of electrical connections between components of package 101 (e.g., circuitries in die 103) and other devices outside package 101. FIG. 1 and FIG. 2 show example numbers and locations of connections 102b of package 101. However, the number and locations of connections 102b can vary.

As shown in FIG. 1, base 102 can include conductive paths 102c coupled between connections 102b (or alternatively leads 102L) and respect conductive contacts 171 through 179. Signals transmitted between circuitries of package 101 and an external device (or external devices) can be conducted through connections 102b (or leads 102L) and conductive paths 102c. The signals can include power (e.g., supply power) signals (e.g., Vcc (supply voltage) and Vss (ground)), data signals (e.g., input/output (I/O) signals), control signals, and other signals. Thus, conductive contacts 171 through 179 can include supply power contacts (contacts to carry power signals). The supply power contacts can include at least one positive supply voltage contact (e.g., Vcc contact) and at least one ground contact (e.g., Vss contact). Conductive contacts 171 through 179 can also include data signal contacts (e.g., I/O contacts) which are contacts to carry data signals, and control signal contacts (contacts to carry control signals). Conductive paths 102c can be coupled to respective supply power contacts, data signal contacts, and control signal contacts of conductive contacts 171 through 179. A conductive path among each of conductive paths 102c can include different conductive regions (e.g., metal regions) that can be part of metal lines and metal via structures of base 102. For simplicity, FIG. 1 partially and symbolically shows conductive paths 102c as thin lines.

Die 103 (FIG. 1 and FIG. 2) of package 101 (which is also the die of memory device 105) can include a semiconductor die (e.g., silicon die). Die 103 can include memory cells and associated circuitries. Such circuitries can be part of memory device 105 and can include decoder circuits (e.g., word line and bit line decoders), driver circuits (e.g., word line drivers), buffers (e.g., page buffer circuits), sense amplifiers, charge pumps, and other circuitry of memory device 105.

Enclosure 104 (shown in FIG. 1 and not shown in FIG. 2) of package 101 (which is also the enclosure of memory device 105) can be formed (e.g., blanked) over die 103 and over at least a portion of base 102. As shown in FIG. 1, enclosure 104 can be formed over surface 102s of base 102, such that conductive contacts 171 through 179 can directly contact the material (e.g., epoxy) of enclosure 104. Enclosure 104 can protect die 103 from damage (e.g., physical damage) and can electrically isolate die 103 from other devices (e.g., devices outside package 101). Enclosure 104 can include epoxy or other electrically non-conductive encapsulation materials.

As shown in FIG. 1, die 103 can include a substrate 110 over which (or in which) some of the components of memory device 105 can be formed. Substrate 110 can include a semiconductor substrate (e.g., silicon-based substrate). For example, substrate 110 can include a p-type silicon substrate (silicon substrate doped with p-type dopant material) or an n-type silicon substrate (silicon substrate doped with n-type dopant material). Substrate 110 can include an edge (e.g., left edge in X-direction) 110L and an edge (e.g., right edge in the X-direction) 110R opposite from edge 110L with respect to the X-direction (which is perpendicular to the Z-direction). As shown in FIG. 1, the Z-direction is perpendicular to (e.g., extends outward from) substrate 110. The Z-direction can be a viewed a vertical direction with respect to substrate 110. Thus, edges 110L and 110R can be vertical edges of substrate 110. Since substrate 110 is part of die 103, edges 110L and 110R can also be the edges (or part of the edges (e.g., vertical edges)) of die 103.

As shown in FIG. 1, substrate 110 can include portions (e.g., semiconductor portions) 111, 112, and 113 located adjacent each other in the X-direction. For example, portion 111 (e.g., left portion) is located adjacent (e.g., located near or immediately next to) edge 110L. Portion 113 (e.g., right portion) is located adjacent (e.g., located near or immediately next to) edge 110R. Portion 112 is located between (e.g., located immediately next to) portions 111 and 113 in the X-direction. Some of the components (e.g., circuitries) of memory device 105 can be located on (e.g., formed in or formed on) different portions of substrate 110.

As shown in FIG. 1, memory device 105 can include circuitries 121, 122, and 123 formed in portions (e.g., active regions) of substrate 110 that are over respective portions 111, 112, and 113. Each of circuitries 121, 122, and 123 can include circuit elements (e.g., transistors) that can be configured to perform part of a function of a memory device (e.g., memory device 105). For example, circuitries 121, 122, and 123 (separately or in any combination) can include (or can be part of) decoder circuits, driver circuits, buffers, sense amplifiers, charge pumps, and other circuitry of memory device 105. FIG. 1 symbolically shows only transistors T1, T2, and T3 included in circuitries 121, 122, and 123, respectively, as an example. However, circuitries 121, 122, and 123 can include additional circuit elements (e.g., resistors, capacitors, and inverters, and conductive paths)

besides transistors. Transistors (e.g., transistors T1, T2, and T3) in circuitries 121, 122, and 123 can be formed using complementary metal-oxide-semiconductor (CMOS) process or other processes. For example, the transistors in circuitries 121, 122, and 123 can include n-channel metal-oxide semiconductor (NMOS) transistors and 123 p-channel metal-oxide semiconductor PMOS transistors that are formed using CMOS process.

Substrate 110 can include active regions and inactive regions. An active region of substrate 110 can contain at least part of a circuit element (e.g., at least source, drain, and channel of a transistor). Such a circuit element can be structured to perform a specific function (e.g., function of a transistor). For example, circuitries 121, 122, and 123 can include circuit elements (e.g., respective transistors T1, T2, and T3) that are configured to perform part of a function of memory device 105. Thus, circuitries 121, 122, and 123 are located on (e.g., are part of) an active region (or active regions) of substrate 110. An inactive region of substrate 110 may contain no circuit elements (e.g., no transistors). As shown in FIG. 1, portions 111, 112, and 113 of substrate may include no circuit elements (e.g., no transistors or no part of a transistor). For example, entire portions 111, 112, and 113 may remain the same (e.g., may include the same material (e.g., p-type silicon)) before and after circuitries 121, 122, and 123 are formed. Thus, portions 111, 112, and 113 are located on (e.g., are part of) an inactive region (or active regions) of substrate 110.

Memory device 105 (FIG. 1 and FIG. 2) can include a memory cell portion (e.g., memory array) 131, a routing portion 132, a conductive pad (e.g., bond pad (or bonding pad)) portion 133, and a routing portion 134. As shown in FIG. 1 and FIG. 2, at least part of memory cell portion 131 (e.g., either part of memory cell portion 131 or the entire memory cell portion 131) can be located over (e.g., directly over (in the Z-direction)) at least part of circuitry 121 and over (e.g., directly over (in the Z-direction)) at least part of portion 111 of substrate 110.

Conductive pad portion 133 is located outside memory cell portion 131. At least part of conductive pad portion 133 (e.g., either part of conductive pad portion 133 or the entire conductive pad portion 133) can be located over (e.g., directly over (in the Z-direction)) at least part of circuitry 123 and over (e.g., directly over (in the Z-direction)) at least part of portion 113 of substrate 110.

As shown in FIG. 1 and FIG. 2, routing portions 132 and 134 can be located on opposite sides (e.g., left side and right side in the X-direction) of memory cell portion 131. At least part of routing portion 132 (e.g., either part of routing portion 132 or the entire routing portion 132) can be located over (e.g., directly over (in the Z-direction)) at least a portion of circuitry 122 and over (e.g., directly over (in the Z-direction)) at least part of portion 112 of substrate 110. At least part of routing portion 134 (e.g., either part of routing portion 134 or the entire routing portion 134) can be located over at least part of circuitry 121 and over (e.g., directly over (in the Z-direction)) at least part of portion 111 of substrate 110.

Memory cell portion 131 can include memory cells, each of which is labeled as "CELL" in FIG. 1. The memory cells can be located on different levels (physical device levels) of memory device 105. FIG. 1 shows memory device 105 including levels (physical device levels) 141, 142, 143, 144, 145, 146, and 147 (141 through 147). Levels 141 through 147 are different levels of memory device 105 in the Z-direction. The memory cells of memory cell portion 131 can be located on respective levels (e.g., four levels) 143, 144, 145, and 146.

Circuitries 121, 122, and 123 can be located on the same level (e.g., level 142). As shown in FIG. 1, at least a portion of circuitry 121 can be located under (e.g., directly under (in the Z-direction)) memory cell portion 131 and over (e.g., directly over (in the Z-direction)) portion 111 of substrate 110. At least a portion of circuitry 122 can be located under (e.g., directly under (in the Z-direction)) routing portion 132 and over (e.g., directly over (in the Z-direction)) portion 112 of substrate 110. At least a portion of circuitry 123 can be located under (e.g., directly under (in the Z-direction)) routing portion 132 and over (e.g., directly over) portion 113 of substrate 110.

FIG. 1 shows an example of four levels (e.g., four tiers) of memory cells (on respective levels 143, 144, 145, and 146) of memory cell portion 131. However, memory cell portion 131 can include a different number of levels (e.g., 8, 16, 32, 64, 126 or more levels) of memory cells.

The memory cells of memory cell portion 131 can be arranged in memory cell strings 131s (three memory cell strings 131s are shown as an example). Each of memory cell strings 131s can include memory cells (four memory cells are shown as an example) from different levels (e.g., levels 143, 144, 145, and 146) of memory device 105. The memory cells in each of memory cell strings 131s can be connected in series with each other and can be located one memory cell over another (e.g., located vertically) with respect to substrate 110.

As mentioned above, memory device 105 can include a non-volatile memory device (e.g., NAND flash memory device). Thus, the memory cells of memory cell strings 131s can include non-volatile memory cells (e.g., NAND flash memory cells). Each of the memory cells of memory cell strings 103s can be configured to store at least one bit (e.g., only single bit or multiple bits) of information (e.g., data). Each of memory cell strings 131s can have a structure similar to or the same as the structure of a memory cell string of memory device 501 described below with reference to FIG. 5

As shown in FIG. 1 and FIG. 2, each of routing portions 132 and 134 (FIG. 1 and FIG. 2) and conductive pad portion 133 can include conductive paths 132c, 134c, and 133c, respectively. Conductive paths 132c, 134c, and 133c can be part of electrical connections among circuit elements in memory device 105. For example, conductive paths 132c, 134c, and 133c can be part of electrical connections among memory cell portion 131 and circuitries 121, 122, and 123.

Conductive paths 132c, 134c, and 133c can carry signals conducted (e.g., transmitted) among circuit elements of memory device 105. The signals can include power signals (e.g., Vcc and Vss signals), data signals, control signals, and other signals. A conductive path among each of conductive paths 132c, 134c, and 133c can include different conductive regions (e.g., metal regions) that can be part of metal lines and metal via structure of die 103. For simplicity, FIG. 1 and FIG. 2 partially and symbolically show conductive paths 132c, 134c, and 133c as thin lines.

As shown in FIG. 1 and FIG. 2, conductive pad portion 133 can include conductive pads (e.g., bond pads (or bonding pads)) 151, 152, 153, 154, 155, 156, 157, 158, and 159 (151 through 159). Conductive pads 151 through 157 can be located on (e.g., formed on) a surface 133s of die 103 and adjacent (e.g., near or immediately next to) edge 110R of die 103. Surface 133s can be the top-most surface of a dielectric material of conductive pad portion 133. Each of conductive pads 151 through 159 can include a conductive material (e.g., single metal) or materials (e.g., an alloy). Example materials for conductive pads 151 through 159 include copper, gold, and other conductive materials. As shown in FIG. 1, enclosure 104 can be formed over the components of die 103 including conductive paths 132c, 134c, and 133c, such that conductive pads 151 through 159 can directly contact the material (e.g., epoxy) of enclosure 104.

Signals transmitted between circuitries of die 103 and external device (or external devices) can be conducted through conductive pads 151 through 159. As described above, the signals can include power signals (e.g., Vcc and Vss signals), data signals (e.g., (I/O) signals), control signals, and other signals. Thus, conductive pads 151 through 159 can include supply power pads (pads to carry power signals). The supply power pads can include at least one positive supply voltage pad (e.g., Vcc pad) and at least one ground contact (e.g., Vss pad). Conductive pads 151 through 159 can also include data signal pads (e.g., I/O pads) which are pads to carry data signals, and control signal pads (pads to carry control signals).

At least a portion of each of conductive paths 132c, 133c, and 134c can be coupled to conductive pads 151 through 159. Thus, at least one of conductive paths 132c can be coupled to at least one of supply power pads, data signal pads, and control signal contacts of conductive pads 151 through 159. At least one of conductive paths 134c can be coupled to at least one of supply power pads, data signal pads, and control signal contacts of conductive pads 151 through 159. At least one of conductive paths 133c can be coupled to at least one of supply power pads, data signal pads, and control signal contacts of conductive pads 151 through 159.

Package 101 can include wires (e.g., bonding wires) 161, 162, 163, 164, 165, 166, 167, 168, and 169 (161 through 169). Each of wires 161 through 169 can include an end (e.g., end portion) coupled (e.g., coupled by solder) to one of conductive pads 151 through 159 and another end (e.g., another end portion) coupled (e.g., coupled by solder) to one of conductive contacts 171 through 179. Each of wires 161 through 169 can include a conductive material (e.g., single metal) or materials (e.g., an alloy). Example materials for wires 161 through 169 include copper, gold, and other conductive materials. As shown in FIG. 1, enclosure 104 can be formed, such that wires 161 through 169 can directly contact the material (e.g., epoxy) of enclosure 104 and can be surrounded (e.g., completely surrounded) by the material of enclosure 104.

Thus, as shown in FIG. 1 and FIG. 2, each of conductive pads 151 through 159 can be part of an electrical path (e.g., conductive circuit path) directly coupled to a conductive contact (e.g., one of conductive contacts 171 through 179) of base 102 in which the conductive contact is located outside substrate 110. For example, conductive pad 151 can be part of an electrical path (e.g., the electrical path that includes conductive pad 151 and wire 161) that is directly coupled to conductive contact 171 of base 102. In another example, conductive pad 152 can be part of an electrical path (e.g., the electrical path that includes conductive pad 152 and wire 162) that is directly coupled to conductive contact 172 of base 102.

Memory device 105 may include other structures, which are not shown in FIG. 1 and FIG. 2 so as not to obscure the example embodiments described herein.

FIG. 3 shows a side view of package 101 taken from line 3-3 in FIG. 2. As shown in FIG. 3, circuitry 123 can include circuits 123.1 through 123.9 located under (e.g., directly under) conductive pads 151 through 159, respectively. For example, at least a portion of circuit 123.1 (i.e., a portion of circuit 123.1 or the entire circuit 123.1) can be directly located under conductive pad 151. In another example, least a portion of circuit 123.3 (i.e., a portion of circuit 123.3 or the entire circuit 123.3) can be directly located under conductive pad 153. In a further example, least a portion of circuit 123.5 (i.e., a portion of circuit 123.3 or the entire circuit 123.5) can be directly located under conductive pad 155.

Each of circuits 123.1 through 123.9 can be located on (e.g., formed in) a region (e.g., active region) of substrate 110 and over portion 111 (e.g., inactive region) of substrate 110. FIG. 3 shows an example where circuitry 123 include nine circuits 123.1 through 123.9. However, the number of circuits in circuitry 123 can vary.

At least one of circuits 123.1 through 123.9 can include circuit elements (e.g., transistors (e.g., transistor T3 shown in FIG. 1)) that can be configured to perform part of a function (or functions) of a memory device (e.g., memory device 105). For example, at least one of circuits 123.1 through 123.9 can include (or can be part of) decoder circuits, driver circuits, buffers, sense amplifiers, charge pumps, and other circuitry of memory device 105. Two or more of circuits 123.1 through 123.9 can be configured to perform the same function. The circuit elements (e.g., transistors) in circuits 123.1 through 123.9 can be formed using CMOS process or other processes.

Circuits 123.1 through 123.9 can be electrically coupled to other parts of memory device 105 (e.g., to memory cell portion 131 and circuitries 121 and 122 (FIG. 1) through at least part of conductive paths 133c. Circuits 123.1 through 123.9 can also be electrically coupled to conductive pads 151 through 159 through conductive paths 133c.

As shown in FIG. 3, conductive pad portion 133 can include levels (e.g., different layers) of conductive material (e.g., metal) 331 and 332 located on (e.g., formed in) different levels in the Z-direction in conductive pad portion 133. Each of the levels of conductive material 331 and 332 can include conductive material regions. For example, the level of conductive material 331 can include conductive regions (e.g., metal lines) 331.1, 331.2, and 331.3. In another example, the level of conductive material 332 can include conductive regions (e.g., metal lines) 332.1, 332.2, and 332.3.

FIG. 3 shows an example where conductive regions 331.1, 331.2, and 331.3 are separated (e.g., electrically separated) from each other as an example. However, at least two (two or more or all) of conductive regions 331.1, 331.2, and 331.3 can be electrically coupled to each other (e.g., coupled to each other by a material (e.g., metal). Such a material (not shown) can be the same material as the material (e.g., metal) that forms conductive regions 331.1, 331.2, and 331.3 and can be located on the same level (e.g., level of conductive material 331) as conductive regions 331.1, 331.2, and 331.3.

Similarly, FIG. 3 shows an example where conductive regions 332.1, 332.2, and 332.3 are separated (e.g., electrically separated) from each other as an example. However, at least two (two or more or all) of conductive regions 332.1, 332.2, and 332.3 can be electrically coupled to each other (e.g., coupled to each other by a material (e.g., not shown)). Such a material can be the same material as the material (e.g., metal) that forms conductive regions 332.1, 332.2, and 332.3 and can be located on the same level (e.g., level of conductive material 332) as conductive regions 332.1, 332.2, and 332.3.

Package 101 can include conductive regions (e.g., metals) 320 to electrically couple circuits 123.1 through 123.9 to respective conductive regions 331.1, 331.2, and 331.3. Each of conductive regions 320 can include or be included in a conductive via extending in the Z-direction (e.g., a vertical metal via between respective circuits 123.1 through 123.9 and respective conductive regions 331.1, 331.2, and 331.3). FIG. 3 shows an example of one of conductive regions 320 coupled between one of circuits 123.1 through 123.9 and one of conductive regions 331.1, 331.2, and 331.3. However, package 101 can include more than one conductive material (e.g., more than one vertical metal via) electrically coupled to a respective circuit among circuits 123.1 through 123.9 and to at least one of conductive regions 331.1, 331.2, and 331.3.

Package 101 can include conductive materials (e.g., metals) 321 to electrically couple conductive regions 331.1, 331.2, and 331.3 to respective conductive regions 332.1, 332.2, and 332.3. Each of conductive regions 321 can include or be included in a conductive via extending in the Z-direction (e.g., a vertical metal via between one of conductive regions 331.1, 331.2, and 331 and one of conductive regions 332.1, 332.2, and 332.3). However, package 101 can include more than one conductive material (e.g., more than one vertical metal via) electrically coupled to a respective conductive region among conductive regions 332.1, 332.2, and 332.3 and a conductive region among conductive regions 332.1, 332.2, and 332.3.

Package 101 can include conductive materials (e.g., metals) 322 to electrically couple conductive regions 332.1, 332.2, and 332.3 to other respective conductive regions of conductive paths 133c.

As shown in FIG. 3 at least one of circuits 123.1 through 123.9 can include a sensor circuit, for example, sensor circuit 123.5. Sensor circuit 123.5 can include at least one ring oscillator (RO) (e.g., RO 431 and RO 432), as described in more detail with reference to FIG. 4.

FIG. 3 shows that circuit 123.2 and 123.8 can also optionally include a sensor circuit, which can be similar to or the same as sensor circuit 123.5. FIG. 3 shows circuitry 123 including up to three sensor circuits 123.2, 123.5, and 123.8 as an example. However, the number of circuits in circuitry 123 can be different from three. For example, circuitry 123 can include only one sensor circuit (e.g., one of sensor circuits 123.2, 123.5, and 123.8), only two sensor circuits, or more than three sensor circuits. FIG. 3 shows example locations of sensor circuit 123.5 and other (optional) sensor circuits of circuitry 123. However, the location of sensor circuit 123.5 (and the location of each of sensor circuits 123.2 and 123.8) can be different from the location shown in FIG. 3. The following description refers to the operations and functions (e.g., purposes) of sensor circuit 123.5. Sensor circuit 123.3, 123.8, or both (if they are included in package 101) can have similar operations and functions.

Sensor circuit 123.5 can be configured (e.g., structured) to operate and provide information (e.g., evaluation information) that can be analyzed to maintain the reliability of circuitry formed in the portion of die 103 where sensor circuit 123.5 are located (placed). For example, the information provided by sensor circuit 123.5 can be used to determine whether a region of substrate 110 (e.g., region that contains circuitry 123) under conductive pad portion 133 can be reliably used for forming circuitry (e.g., circuitry 123). Information provided by sensor circuit 123.5 can also be used to improve part of the fabrication process (e.g., packaging and bonding during assembly process) of forming package 101. For example, the information provided by sensor circuit 123.5 can be used to detect stress on part of die 103 (e.g., stress on conductive pads 151 through 159, conductive pad portion 133, and portion of substrate 110 under conductive pad portion 133). Based on the detection, adjustment (e.g., packaging and bonding procedure during assembly of package 101) can be made to prevent or reduce such stress. This can avoid permanent damage to the die and can maintain the reliability of circuitry (e.g., circuitry 123) formed in (or formed on) a portion of substrate 110 that is located under conductive pads 151 through 159.

Sensor circuit 123.5 can be electrically coupled (e.g., coupled through conductive paths 133c) to at least one of conductive pads 151 through 159, such that sensor circuit 123.5 can be accessed from conductive pads 151 through 159 (e.g., through conductive paths 133c). Sensor circuit 123.5 can be configured to be electrically accessible during at least one stage among different stages of fabrication of package 101 (fabrication of memory device 105). For example, sensor circuit 123.5 can be enabled (e.g., activated) and accessed during a pre-package stage to provide pre-package information and a post-package stage to provide post-package information. The pre-package stage can occur before die 103 is assembled in package 101 (e.g., before wires 161 through 169 (FIG. 1 and FIG. 2) are formed). The post-package stage can occur after the pre-package stage and after die 103 is assembled in package 101 (e.g., after wires 161 through 169 are formed). The pre-package information and the post-package information collected from sensor circuit 123.5 can be analyzed to determine whether a particular portion of die 103 can be improved or can be reliably used. Such a particular portion can include a region of substrate 110 where circuitry 123 (FIG. 1, FIG. 2, and FIG. 3) is formed.

Analyzing the pre-package information and the post-package information can include comparing the post-package information with the pre-package information. Based on the comparison, deviation of the post-package information relative to the pre-package information can be corrected to reduce or mitigate the stress that may occur during post-package assembly. This can reduce permanent damage (e.g., damage near conductive pad portion 133) and improve the reliability and quality of circuitry (e.g., circuitry 123) formed in the portion of substrate 110 under conductive pad portion 133.

Sensor circuit 123.5 can be configured to operate in a test mode (e.g., probe test mode). The test mode can occur during at least one stage among different stages of fabrication of package 101 (fabrication of memory device 105). For example, the test mode can occur during the pre-package stage, during the post-package stage, or during both the pre-package stage and the post-package stage. The test mode can be part of a test mode of memory device 105. Alternatively, the test mode can be a separate test mode dedicated to collect information (e.g., information IN shown in FIG. 4) from sensor circuit 123.5.

Sensor circuit 123.5 can be disabled (e.g., deactivated) during normal operations (e.g., normal modes) of memory device 105. For example, sensor circuit 123.5 can be disabled (e.g., to not anticipate in a normal operation of memory device 105) after package 101 is shipped to a user of package 101 or after package 101 is installed in a system (e.g., a SoC, a SoP, a cellular phone, a computer, or other electronic systems).

Figure 4:
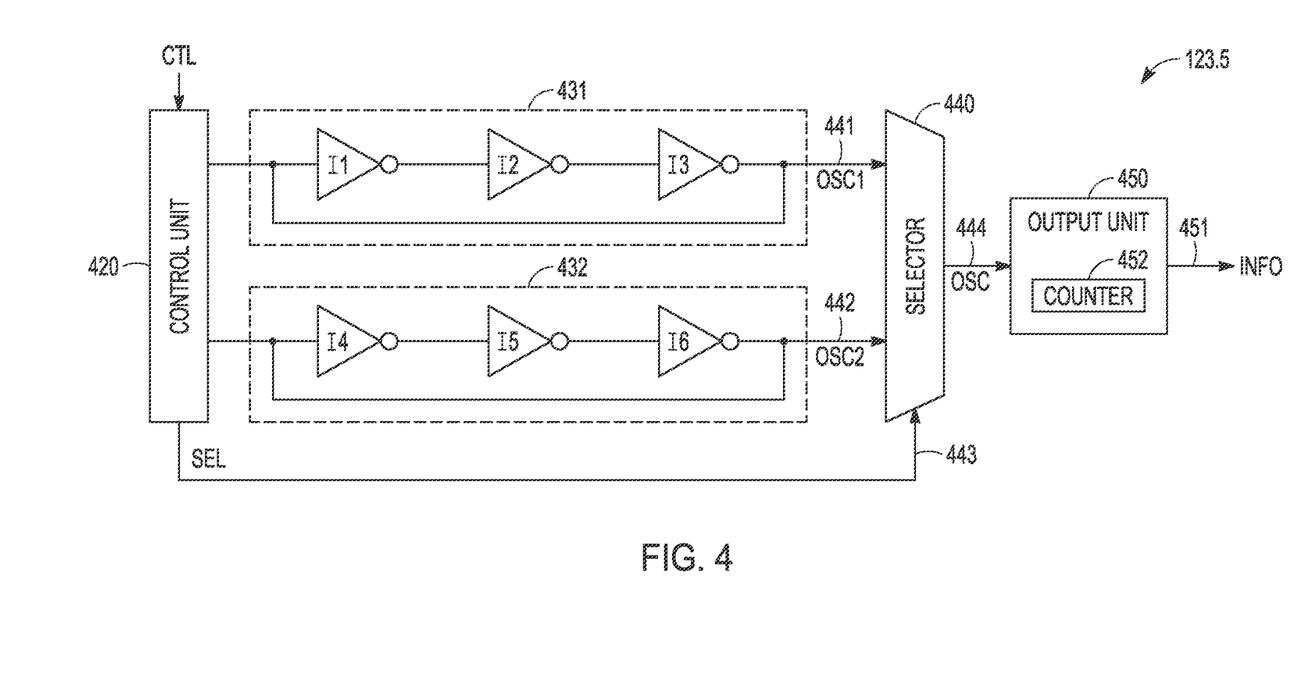
FIG. 4 shows a schematic diagram of a sensor circuit of the circuitry of FIG. 3 including ring oscillators, according to some embodiments described herein.

FIG. 4 shows sensor circuit 123.5 of circuitry 123 of FIG. 3 including ring oscillators 431 and 432, according to some embodiments described herein. As shown in FIG. 4 sensor circuit 123.5 can provide (e.g., generate) information (e.g., evaluation information) INFO. Information INFO can be collected by a collection unit (not shown) that can be located on die 103 or on testing equipment (e.g., a tester) external to die 103. Information INFO can be stored (e.g., stored off-die, such as in a testing equipment). Then, information INFO can be used for analyzing electrical and physical properties of a portion of die 103 (e.g., portion at the location of circuitry 123 in FIG. 1) during pre-package stage and post-package stage.

As shown in FIG. 4, sensor circuit 123.5 can include a control unit 420 coupled to ring oscillators 431 and 432, a selector (e.g., a multiplexer) 440, and an output unit 450. Control unit 420 can receive control information CTL to control operation of sensor circuit 123.5. Control information CTL can be provided to control unit 420 from testing equipment (not shown) or from a control unit (e.g., test mode control unit, not shown) located on die 103. Control information CTL can include at least clock information (e.g., a clock signal CLK not shown), counter start and stop signals (e.g., to control a counter 451), and select information to control selector 440. Control unit 420 can provide the clock information as an input signal to an input node (not labeled) of each of ring oscillators 431 and 432. Control unit 420 can use the select information to control a signal SEL and cause selector 440 to select one of signals (e.g., oscillating signals) OSC1 and OSC2 as signal (e.g., oscillating signal) OSC.

Ring oscillator 431 can include inverters (e.g., an odd number of inverters) I1, I2, and I3 connected in series with each other. Ring oscillator 432 can include inverters (e.g., an odd number of inverters) I4, I5, and I6 connected in series with each other. As shown in FIG. 4, series-connected inverters I1, I2, and I3 are coupled in parallel with series-connected inverters I4, I5, and I6 between control unit 420 and selector 440.

Ring oscillators 431 and 432 can operate at different supply voltages. For example, ring oscillators 431 and 432 can operate at supply voltages Vcc1 and Vcc2, respectively. The value of supply voltage Vcc2 can be less than the value of supply voltage Vcc1. Ring oscillators 431 and 432 can generate signals OSC1 and OSC2, respectively. The frequency of each of signals OSC1 and OSC2 can be based on the frequency of the clock signal (e.g., signal CLK, not shown) included in control information CTL. Since ring oscillators 431 and 432 can operate at different supply voltages, the frequencies of signals OSC1 and OSC2 can be different. For example, signal OSC1 can have a frequency greater than the frequency of signal OSC2.

Selector 440 can include input nodes 441 and 442, a select node 443, and an output node 444. Selector 440 can receive signal SEL to select either signal OSC1 at input node 441 or signal OSC2 at input node 442 and provide (e.g., pass) the selected signal (signal OSC1 or signal OSC2) to output node 444 as signal OSC. Thus, signal OSC can be based on either signal OSC1 (e.g., if oscillator 431 is selected) or signal OSC2 (e.g., if oscillator 432 is selected).

Output unit 450 can receive signal OSC and generate information (e.g., output information) INFO based on signal OSC. Information INFO can include timing information (e.g., a number of cycles (periods)) of signal OSC. For example, information INFO can include a number of cycles of signal OSC within a time interval (e.g., fixed amount of time), which is a predetermined time interval that can be included in control information CTL. Output unit 450 can include a counter 451 to count the number of cycles of the signal OSC within such a time interval. Control information CTL can cause counter 451 to start and stop counting the number of cycles of signal OSC within the time interval based on the counter start and stop signals, respectively, included in control information CTL.

FIG. 4 shows sensor circuit 123.5 including two ring oscillators 431 and 432 as an example. However, the number of ring oscillators of sensor circuit 123.5 can be different from two. The number of ring oscillators can be dependent on the number of different types the components (e.g., transistors) of circuitry formed of die 103. For example, die 103 may include transistors (e.g., NMOS and PMOS) that may have two different gate oxide thicknesses. In this example, sensor circuit 123.5 can include two ring oscillators (e.g., ring oscillators 431 and 432) to allow analyzing the different types (e.g., two different gate oxide thicknesses) of the transistors of die 103.

As described above, information (e.g., evaluation information) can be collected from sensor circuit 123.5 during a pre-package stage and a post-package stage. In FIG. 4, different information can be collected in each of the pre-package stage and the post-package stage. For example, information INFO can include information INFO_pre1, INFO_post1, INFO_pre2, and INFO_post2. Information INFO_pre1 and INFO_post1 can be collected based the operation of ring oscillator 431 during the pre-package and the post-package stages, respectively. Information INFO_pre2 and INFO_post2 can be collected based the operation of ring oscillator 432 during the pre-package and the post-package stages, respectively. These collected information (e.g., INFO_pre1, INFO_post1, INFO_pre2, and INFO_post2) can be used to analyze the electrical and physical properties of a portion of die 103 (e.g., portion at the location of circuitry 123 in FIG. 1) during pre-package stage and post-package stage.

Each information INFO_pre1 and INFO_post1 can include a number of cycles of signal OSC within the same time interval (e.g., X units of time). For example, information INFO_pre1 may include N cycles of signal OSC within X seconds, and information INFO_post1 may include M cycles of signal OSC within X seconds (where N and M are integers and X is a positive number). In this example, the values of N and M can be the same (or substantially the same) or can be different depending on the electrical and physical properties of a portion of die 103 (e.g., portion at the location of circuitry 123 in FIG. 1) during pre-package stage and post-package stage.

Each information INFO_pre2 and INFO_post2 can include a number of cycles of signal OSC within the same time interval (e.g., Y units of time). For example, information INFO_pre1 may include O cycles of signal OSC within Y seconds, and information INFO_post1 may include P cycles of signal OSC within Y seconds (where O and P are integers and Y is a positive number). In this example, the values of O and P can be the same (or substantially the same) or can be different depending on the electrical and physical properties of a portion of die 103 (e.g., portion at the location of circuitry 123 in FIG. 1).

As described above, analyzing the pre-package information and the post-package information can include comparing the post-package information with the pre-package information. For example, information INFO_pre1 can be compared with information INFO_post1, and information INFO_post1 can be compared with information INFO_post2. The result from the comparison can be used to adjust fabrication parameters (e.g., process and temperature) to predict and reduce permanent damage (e.g., due to die stress during bonding and packaging) and improve the reliability and quality of circuitry (e.g., circuitry 123) formed in a portion of substrate 110 under conductive pad portion 133. For example, if the difference (e.g., clock shift resulted from the comparison) in the value (e.g., M number of cycles of signal OSC) of INFO_post1 and the value (e.g., N number of cycles of signal OSC) is greater than an acceptable margin (e.g., a predetermined margin), then adjustment can be performed to adjust fabrication parameters (e.g., during pre-package stage, post-package stage, or both) to reduce the difference (e.g., reduce clock shift) between the values of post-package information and pre-package information. In another example, if the difference (e.g., clock shift resulted from the comparison) in the value (e.g., O number of cycles of signal OSC) of INFO_post2 and the value (e.g., P number of cycles of signal OSC) is greater than an acceptable margin (e.g., a predetermined margin), then adjustment can be performed to adjust fabrication parameters (e.g., during pre-package stage, post-package stage, or both) to reduce the difference (e.g., reduce clock shift) between the values of post-package information and pre-package information.

The comparison described above can be based on pre-package information and post-package information collected from the same die, from different dies of the same wafer, from dies on one wafer to dies of another wafer, and from wafers of one lot to wafers of another lot. The comparison can be performed to determine the difference (e.g., clock shift) in values between pre-package information and post-package information within the same die, the range (e.g., distribution) of clocks among the dies of the same wafer, the range (e.g., distribution) of clocks (e.g., based on pre-package information and post-package information) from dies of one wafer to dies of another wafer, and the range (e.g., distribution) of clocks from wafers of one lot to wafers of another lot. As described above, based on the comparison, correction (e.g., adjustment of process and temperature) can be made to reduce permanent damage (e.g., damage near conductive pad portion 133) and improve the reliability and quality of circuitry (e.g., circuitry 123) formed in portion of substrate 110 under conductive pad portion 133.

FIG. 4 shows ring oscillators 431 and 432 being part of sensor circuit 123.5 (for generating information INFO) as an example. However, other types of electrical elements (different from ring oscillators) can be included in sensor circuit 123.5 as long as such electrical elements can allow sensor circuit 123.5 to provide information (e.g., pre-package information and post-package information) that can be used to analyze the electrical and physical properties of a portion of die 103 as described above.

Figure 5:
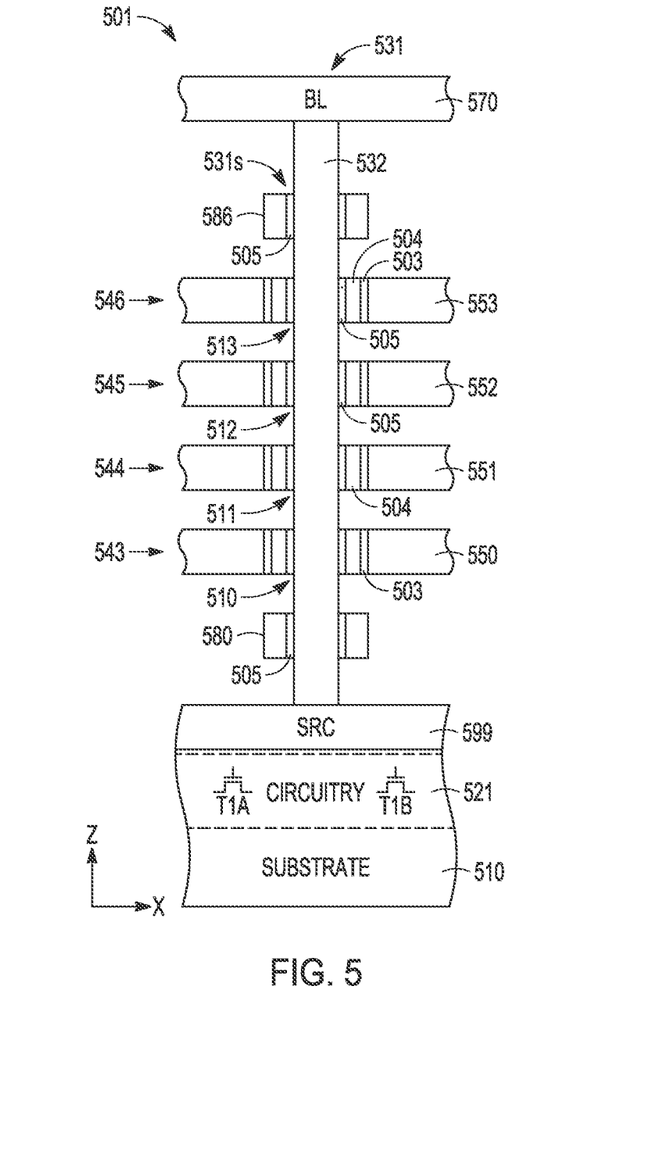
FIG. 5 shows a structure of a portion of a memory device including memory cells located on different levels of the memory device, according to some embodiments described herein.

FIG. 5 shows a side view of a structure of a portion of memory device 501, according to some embodiments described herein. Memory device 501 can include a substrate 590, memory cell portion (e.g., a memory cell array) 531 including a memory cell string 531s having memory cells 510, 511, 512, and 513 located on respective levels (physical device levels) 543, 544, 545, and 546, and circuitry 521 formed under memory cell portion 531. At least a portion of memory device 105 (FIG. 1 and FIG. 2) can include the structure of the portion of memory device 501 of FIG. 5. For example, levels 143, 144, 145, and 146 of memory device 105 of FIG. 1 can be similar to or the same as levels 543. 544, 545, and 546, respectively, of memory device 501 of FIG. 5. Memory cell portion 131 (including each of memory cell string 131s) of memory device 105 (FIG. 1 and FIG. 2) can have a structure similar to or the same as the structure of memory cell portion 531 (including memory cell string 531s) of memory device 501 of FIG. 5. Substrate 110 and circuitry 121 memory device 105 of FIG. 1 can have a structure similar to or the same as the structure of substrate 590 and circuitry 521, respectively, of FIG. 5.

In FIG. 5, substrate 590 can include a semiconductor substrate (e.g., silicon-based substrate). For example, substrate 590 can include a p-type silicon substrate or an n-type silicon substrate. Memory cells 510, 511, 512, and 513 can be located one over another in respective levels 543, 544, 545, and 546, respectively, in a z-direction of memory device 501. The z-direction can extend in a direction associated with the thickness of substrate 590. FIG. 5 also shows an x-direction, which is perpendicular to the z-direction.

Memory cell portion 531 can include a pillar 532 having a length extending in the Z-direction. As shown in FIG. 5, memory cells 510, 511, 512, and 513 can be located along respective portions of pillar 532 in the z-direction. Pillar 532 can include a conductive material (e.g., conductively doped polysilicon) that can be configured (e.g., structured) to allow a conduction of current between a conductive region 570 and a conductive region 599. Conductive region 570 can be part of a data line (e.g., a local bit line, labeled as "BL") of memory device 501. Conductive region 599 can be part of a source (e.g., a source region, a source line, or a source plate, labeled as "SRC") of memory device 501.

Memory device 501 can include control gates 550, 551, 552, and 553 can be located along respective portions of pillar 532 in the z-direction. Control gates 550, 551, 552, and 553 can be part of access lines (e.g., local word lines) of memory device 501. The materials of control gates 550, 551, 552, and 553 can include a conductive material (e.g., conductively doped polysilicon, metal, other conductive material).

Memory device 501 can include a select gate (e.g., source select gate (SGS)) 580, and a select gate (e.g., drain select gate (SGD)) 586 located along respective portions of pillar 532 in the z-direction. The materials of select gates 580 and 586 can include a conductive material (e.g., conductively doped polysilicon, metal, other conductive material).

Memory cell string 531 can include materials 503, 504, 505 between a portion of pillar 532 and a respective control gate among control gates 550, 551, 552, and 553. Material 503 can also be between pillar 532 and each of select gates 580 and 586. As shown in FIG. 5, materials 503, 504, and 505 can be separated among memory cells 510, 511, 512, and 513. Materials 503, 504, and 505 located at particular memory cell (among memory cells 510, 511, 512, and 513) can be part (e.g., a memory element) of that particular memory cell.

Material 503 can include a charge blocking material (or charge blocking materials), for example, a dielectric material (e.g., silicon nitride) that is capable of blocking a tunneling of a charge.

Material 504 can include a charge storage material (or charge storage materials) that can provide a charge storage function to represent a value of information stored in memory cell 510, 511, 512, and 513. For example, material 504 can include polysilicon (e.g., conductively doped polysilicon), which can be either a p-type polysilicon or an n-type polysilicon. The polysilicon can be configured to operate as a floating gate (e.g., to store charge) in a memory cell (e.g., a memory cell 510, 511, 512, or 513). In another example, material 504 can include a dielectric material (e.g., silicon-nitride based material or other dielectric materials) that can trap charge in a memory cell (e.g., a memory cell 510, 511, 512, or 513).

Material 505 can include a tunnel dielectric material (or tunnel dielectric materials), for example, silicon dioxide, that is capable of allowing tunneling of a charge (e.g., electrons).

Circuitry 521 can include circuit elements (e.g., transistors) can be configured to perform part of a function of a memory device (e.g., memory device 501). For example, circuitry 521 can include decoder circuits, driver circuits, buffers, sense amplifiers, charge pumps, and other circuitry of memory device 501. FIG. 5 symbolically shows the circuit elements of circuit 521 including example transistors T1A and T1B. Transistors T1A and T1B can be coupled to part of memory cell portion 531 through conductive paths (not shown). Such conductive paths can include a conductive segment (e.g., vertical conductive structures, not shown) extending in the Z-direction. For example, transistor T1A can be part of a driver circuit (e.g., a word line driver) of memory device 501, in which transistor T1A can be coupled (through a conductive path, not shown) to one of control gates 550, 551, 552, and 553 (e.g., part of respective local word lines). In another example, transistor T1B can be part of a sense amplifier of memory device 501, in which transistor T1B can be coupled (through a conductive path, not shown) to conductive region 570 (e.g., part of a local bit line).

Memory device 501 can include a non-volatile (e.g., NAND flash memory device). Thus, memory cells 510, 511, 512, and 513 can include non-volatile memory cells (e.g., NAND flash memory cells). For simplicity, FIG. 5 shows only a portion of memory device 501. Other components of memory device 501 are omitted from FIG. 5 so as to not obscure the example structure of a memory device described herein.

Figure 6:
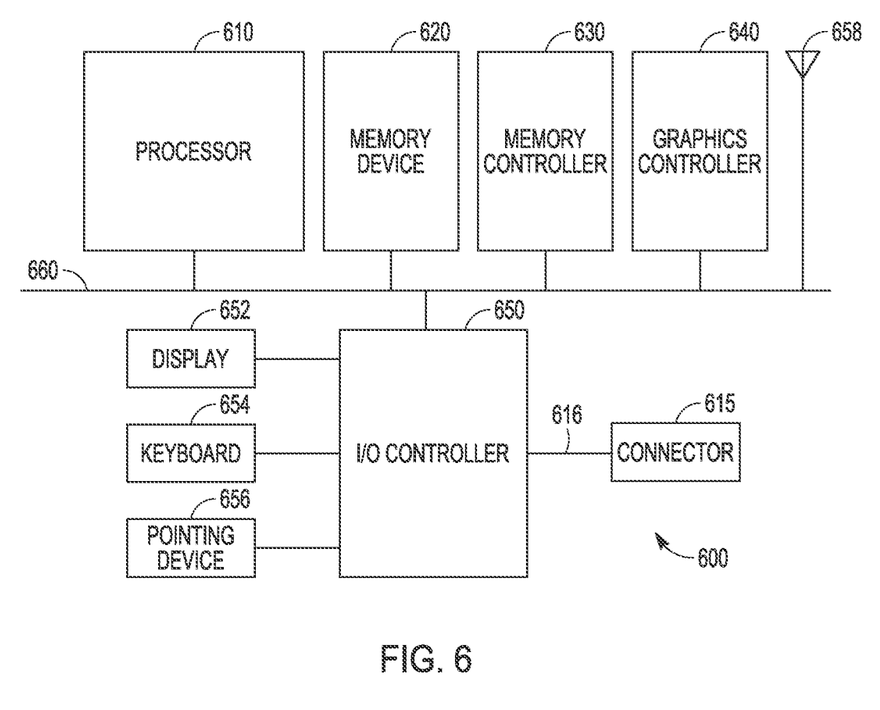
FIG. 6 shows a system including a package, according to some embodiments described herein.

FIG. 6 shows an apparatus in the form of a system (e.g., electronic system) 600, according to some embodiments described herein. Part of system 600 or the entire system 600 can include or be included a system-on-chip, a system on package, a solid state drive, a cellphone, a tablet, a computer, an electronic module in an automobile, or other types of electronic systems. As shown in FIG. 6, system 600 can include a processor 610, a memory device 620, a memory controller 630, a graphics controller 640, an I/O controller 650, a display 652, a keyboard 654, a pointing device 656, at least one antenna 658, a connector 615, and a bus 660 (e.g., conductive lines formed on a circuit board (not shown) of system 600).

In some arrangements, system 600 does not have to include a display. Thus, display 652 can be omitted from system 600. In some arrangements, system 600 does not have to include any antenna. Thus, antenna 658 can be omitted from system 600.

Each of processor 610, memory device 620, memory controller 630, graphics controller 640, and I/O controller 650 can include a die and can be part of an IC package.

Processor 610 can include a general-purpose processor or an application specific integrated circuit (ASIC). Processor 610 can include a central processing unit (CPU).

Memory device 620 can include a dynamic random-access memory (DRAM) device, a static random-access memory (SRAM) device, a flash memory device (e.g., NAND flash memory device), phase change memory, a combination of these memory devices, or other types of memory.

In an example, memory device 620 can include memory device 105 or memory device 501 described above with reference to FIG. 1 through FIG. 5. Thus, memory device 620 can include the structure of memory device 105 (including the structure of package 101) and memory device 501 described above with reference to FIG. 1 through FIG. 5.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through one or more antennas 658). Such wireless communication may include communication in accordance with WiFi communication technique, Long Term Evolution Advanced (LTE-A) communication technique, or other communication techniques.

I/O controller 650 can also include a module to allow system 600 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 615 can be arranged (e.g., can include terminals, such as pins) to allow system 600 to be coupled to an external device (or system). This may allow system 600 to communicate (e.g., exchange information) with such a device (or system) through connector 615. Connector 615 may be coupled to I/O controller 650 through a connection 616 (e.g., a bus).

Connector 615, connection 616, and at least a portion of bus 660 can include elements (e.g., conductive terminals, conductive lines, or other conductive elements) that conform with at least one of USB, DP, HDMI, Thunderbolt, PCIe, Ethernet, and other specifications.

FIG. 6 shows the elements (e.g., devices and controllers) of system 600 arranged separately from each other as an example. In some arrangements, two or more elements (e.g., processor 610, memory device 620, graphics controller 640, and I/O controller 650) of system 600 can be located on the same IC package.

Figure 7:
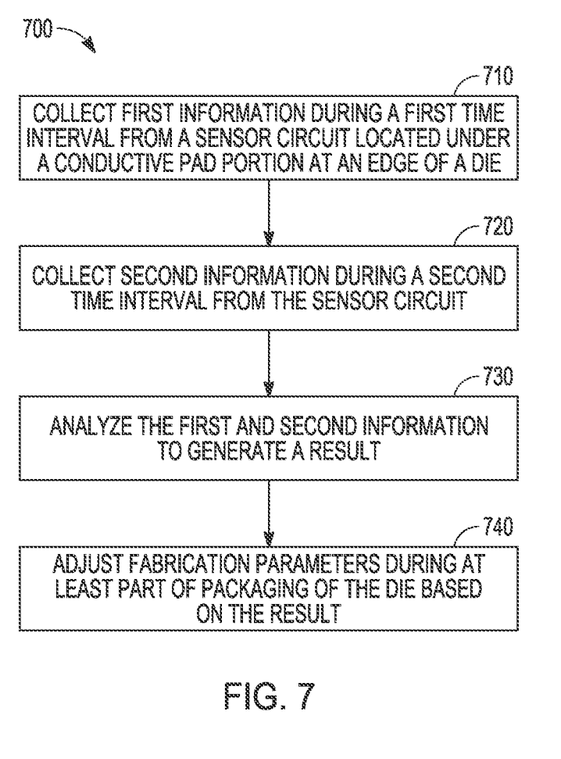
FIG. 7 is a flowchart showing a method of fabricating a package, according to some embodiments described herein.

FIG. 7 is a flowchart showing a method 700 of fabricating a package, according to some embodiments described herein. The package used in method 700 can be any of the package (e.g., package 101) or memory device (e.g., memory device 105) that includes a die (e.g., die 103) described above with reference to FIG. 1 through FIG. 6. As shown in FIG. 7, method 700 can include activities 710, 720, 730, and 740.

Activity 710 can include collecting first information generated during a first time interval from a sensor circuit located under a conductive pad portion at an edge of a die. Sensor circuit in method 700 can include any of circuits 123.2, 123.5, and 123.8 of die 103 (FIG. 3). The first information in activity 710 can correspond to information INFO_pre1 (or INFO_pre2) described above with reference to FIG. 4.

Activity 720 can include collecting second information generated during a second time interval from the sensor circuit. The second information in activity 720 can correspond to information INFO_post1 (or INFO_post2) described above with reference to FIG. 4.

Activity 730 can include analyzing the first and second information to generate a result. Analyzing the first and second information in activity 730 can correspond to analyzing information INFO_pre1, INFO_post1, INFO_pre2, and INFO_post2 described above with reference to FIG. 4.

Activity 740 can include adjusting fabrication parameters during at least part of packaging of the die based on the result. Adjusting fabrication parameters in activity 740 can correspond to adjusting fabrication parameters during at least part of packaging of die 103 described above with reference to FIG. 4.

Method 700 can include fewer activities or more activities than activities 710, 720, 730, and 740 shown in FIG. 7. For example, method 700 can include activities associated with information INFO from sensor circuit 123.5 described above with reference to FIG. 4.

The illustrations of apparatuses (e.g., package 101, memory device 501, and system 600) and methods (e.g., method 700, method of fabricating package 101 or memory devices 105) are intended to provide a general understanding of the structure of various embodiments and are not intended to provide a complete description of all the elements and features of apparatuses that might make use of the structures described herein. An apparatus herein refers to, for example, either a device (e.g., any of package 101 and memory device 501) or a system (e.g., system 600).

Any of the components described above with reference to FIG. 1 through FIG. 7 can be implemented in a number of ways, including simulation via software. Thus, apparatuses (e.g., package 101, memory device 501, and system 600) or part of each of the memory devices and system described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The IC packages and memory devices (e.g., package 101, memory devices 105 and 501) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 7 include apparatuses and methods of operating the apparatuses. One of the apparatuses includes a substrate of a semiconductor die; a memory cell portion located over a first portion of the substrate; a conductive pad portion located over a second portion of the substrate and outside the memory cell portion; and a sensor circuit including a portion located over the second portion of the substrate and under the conductive pad portion. The conductive pad portion includes conductive pads. Each of the conductive pads is part of a respective electrical path coupled to a conductive contact of a base outside the substrate. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a die of a memory device;
   a memory cell portion located over a first portion of the die;
   a conductive pad portion located over a second portion of the die and outside the memory cell portion, the conductive pad portion including conductive pads, each of the conductive pads being part of a respective electrical path coupled to a conductive contact; and
   a sensor circuit located directly over the second portion of the die and under the conductive pad portion, the sensor circuit including:
   a first ring oscillator;
   a second ring oscillator;
   a selector coupled to outputs of the first and second oscillators; and
   an output unit coupled to an output of the selector.

2. The apparatus of claim 1, wherein the sensor circuit is configured to be enabled to provide information used to detect stress on the conductive pads.

3. The apparatus of claim 1, wherein the sensor circuit is configured to be enabled to provide information used to detect stress on the conductive pad portion.

4. The apparatus of claim 1, wherein the sensor circuit is configured to be enabled to provide information used to detect stress on a portion of the memory device under the conductive pad portion.

5. The apparatus of claim 1, further comprising:
a metal level located between the conductive pad portion and the sensor circuit; and
a conductive region located between the sensor circuit and metal level and coupled to the sensor circuit and metal level.

6. The apparatus of claim 5, wherein the metal level is a first metal level, and the apparatus further comprises:
a second metal level located between the conductive pad portion and the first metal level; and
an additional conductive region located between the first second metal levels and coupled to the first second metal levels.

7. The apparatus of claim 6, further comprising a conductive path coupled to the memory cell portion and at least one of the first and second levels of metal.

8. The apparatus of claim 1, wherein the conductive pads include a conductive pad coupled to a supply power contact of the base.

9. The apparatus of claim 1, wherein the conductive pads include a conductive pad coupled to a data input/output contact of the base.

10. An apparatus comprising:
a semiconductor substrate of a memory device;
a memory cell portion located over the semiconductor substrate;
circuitry electrically coupled to the memory cell portion, the circuitry including a portion located under the memory cell portion and over a first portion of the semiconductor substrate;
a conductive pad portion located over a second portion of the semiconductor substrate and outside the memory cell portion, the conductive pad portion including conductive pads;
conductive wires, each of the conductive wires including a first end coupled to a respective conductive pad of the conductive pads, and a second end coupled to a conductive contact of a base; and
a sensor circuit located directly over the second portion of the semiconductor substrate, the sensor circuit including at least a portion having a transistor, the transistor located under a conductive pad among the conductive pads, wherein the sensor circuit is enabled to detect physical stress on at least one of the conductive pads, the conductive pad portion, and part of the memory device under the conductive pad portion.

11. The apparatus of claim 10, wherein the circuit includes an odd number of inverters connected in series with each other.

12. The apparatus of claim 11, wherein the inverters are first inverters, the circuit includes second inverters connected in series with each other, and the first inverters are in parallel with the second inverters.

13. The apparatus of claim 10, wherein the circuitry includes a page buffer circuit located under the memory cell portion and over the first portion of the substrate.

14. The apparatus of claim 10, wherein the circuitry includes a sense amplifier located under the memory cell portion and over the first portion of the substrate.

15. The apparatus of claim 10, wherein the memory cell portion includes a level of material that is part of a word line of the memory device.

16. An apparatus comprising:
a circuit board including conductive contacts;
a memory device located over the circuit board, the memory device including:
a semiconductor substrate;
a memory cell portion located over the semiconductor substrate;
circuitry electrically coupled to the memory cell portion, the circuitry including a portion located under the memory cell portion and over a first portion of the semiconductor substrate;
a conductive pad portion located over a second portion of the semiconductor substrate and outside the memory cell portion, the conductive pad portion including a first conductive pad and a second conductive pad;
a first wire coupled between the first conductive pad and a first conductive contact of the conductive contacts;
a second wire coupled between the second conductive pad and a second conductive contact of the conductive contacts;
a first sensor circuit including at least one first ring oscillator located directly under the first conductive pad; and
a second sensor circuit including at least one second ring oscillator located directly under the second conductive pad, wherein the first and second sensor circuits are disabled in a normal operation of the memory device.

17. The apparatus of claim 16, further comprising conductive paths located on a side of the memory cell portion.

18. The apparatus of claim 16, wherein the conductive paths are the first conductive paths, the side of the memory portion is a first side of the memory portion, the apparatus further comprises second conductive paths located on a second side of the memory cell portion, and the first and second sides are opposite from each other.

19. The apparatus of claim 18, wherein the conductive pads include a supply power pad, and a conductive path among the first and second conductive paths is coupled to the supply power pad.

20. The apparatus of claim 19, wherein the conductive pads include a data signal pad, and an additional conductive path among the first and second conductive paths is coupled to the data signal pad.

* * * * *